(12) United States Patent
Bottemiller et al.

(10) Patent No.: US 9,508,399 B1
(45) Date of Patent: Nov. 29, 2016

(54) RESIDUAL CAPACITANCE PERFORMANCE BOOSTER

(71) Applicant: HGST Netherlands B.V., Amsterdam (NL)

(72) Inventors: Kraig Bottemiller, Rochester, MN (US); Darin Edward Gerhart, Oronoco, MN (US); Cory Lappi, Rochester, MN (US); William Jared Walker, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 15/145,575

(22) Filed: May 3, 2016

(51) Int. Cl.
*G11C 5/14* (2006.01)
*G11C 7/00* (2006.01)

(52) U.S. Cl.
CPC .............. *G11C 5/147* (2013.01); *G11C 5/141* (2013.01); *G11C 7/00* (2013.01)

(58) Field of Classification Search
CPC .............. G11C 13/004; G11C 27/024; G11C 11/4074
See application file for complete search history.

(56) References Cited

U.S. PATENT DOCUMENTS

| | | | | |
|---|---|---|---|---|
| 6,023,429 | A * | 2/2000 | Mecier ..................... | G11C 7/22 365/189.09 |
| 6,795,359 | B1 * | 9/2004 | Baker ...................... | G11C 7/06 365/158 |
| 6,836,145 | B2 * | 12/2004 | Mecier ................... | G11O 5/145 326/38 |
| 6,976,200 | B1 * | 12/2005 | Ohbayashi ............. | G11C 29/32 365/226 |
| 8,627,117 | B2 | 1/2014 | Johnston | |
| 8,719,629 | B2 | 5/2014 | Wilson | |
| 9,208,894 | B2 | 12/2015 | Lee et al. | |
| 2004/0240294 | A1 * | 12/2004 | Baker ...................... | G11C 7/06 365/209 |
| 2009/0067218 | A1 * | 3/2009 | Graber ................... | G11C 7/067 365/149 |
| 2011/0047316 | A1 | 2/2011 | Farhan et al. | |
| 2015/0098291 | A1 | 4/2015 | Datla et al. | |
| 2015/0169021 | A1 | 6/2015 | Salessi et al. | |
| 2016/0012886 | A1 * | 1/2016 | Nazarian .............. | G11C 13/004 365/148 |

FOREIGN PATENT DOCUMENTS

WO 2014141140 A1 9/2014

OTHER PUBLICATIONS

Intel, "Power Loss Imminent (PLI) Technology" Feb. 2014, Retrieved from http://www.intel.in/content/dam/www/public/us/en/documents/technology-briefs/ssd-power-loss-imminent-technology-brief. pdf, 8 pgs.
CAPP-XX, BritePower SSD—Faster, Safer, Longer Supercapacitors in Solid State Drives, Mar. 2012, Retrieved from https://www.tecategroup.com/ultracapacitors-supercapacitors/datastoragedocs/CAP-XX%20BritePower%20SSD%201203.pdf, 17 pgs.

\* cited by examiner

*Primary Examiner* — Tuan T Nguyen
(74) *Attorney, Agent, or Firm* — Shumaker & Sieffert, P.A.

(57) ABSTRACT

In some examples, a method includes determining, by a processor of a controller of a data storage device, that a voltage level of a capacitor in the data storage device is above a threshold voltage value, wherein the data storage device includes a capacitor circuit, and wherein the capacitor circuit includes the capacitor. The method further includes controlling, by the processor, the capacitor circuit to cause the capacitor to provide power to circuitry associated with memory devices of the data storage device along with power provided by a host device operably connected to the data storage device.

20 Claims, 6 Drawing Sheets

RESIDUAL CAPACITANCE PERFORMANCE BOOSTER

TECHNICAL FIELD

This disclosure relates to power storage in data storage devices.

BACKGROUND

Power loss imminent (PLI) or Emergency Power Off (EPO) technologies reduce the possibility of losing data in a data storage device during a power loss event. PLI or EPO technology in a data storage device may include a capacitor that stores energy to be used in event of an unexpected power loss. The energy storing capacitor may provide enough energy to complete any commands in progress and to commit any data in buffers or volatile memory to non-volatile memory.

PLI or EPO technology also may include a detector circuit that monitors the supply voltage of the data storage device. If a fall in the supply voltage indicates that a power loss event is imminent, the data storage device may use the backup energy that is stored in the capacitor to write any data in temporary buffers to the non-volatile memory. After the host restores power to the data storage device, the energy storing capacitor may charge again to prepare for a future power loss event.

SUMMARY

In some examples, the disclosure describes a method including determining, by a processor of a controller of a data storage device, that a voltage level of a capacitor in the data storage device is above a threshold voltage value, wherein the data storage device includes a capacitor circuit, and wherein the capacitor circuit includes the capacitor. The method further includes controlling, by the processor, the capacitor circuit to cause the capacitor to provide power to circuitry associated with memory devices of the data storage device along with power provided by a host device operably connected to the data storage device.

In some examples, the disclosure describes a data storage device operably connected to a host device, where the data storage device includes a controller including a processor, a capacitor circuit including a capacitor, and a plurality of memory devices. The processor is configured to determine that a voltage level of the capacitor is above a threshold voltage value and control the capacitor circuit to cause the capacitor to provide power to circuitry associated with the memory devices along with power provided by the host device.

In some examples, the disclosure describes a computer-readable data storage device including instructions that, when executed, configure one or more processors of the data storage device to determine that a voltage level of a capacitor in a data storage device is above a threshold voltage value, wherein the data storage device includes a capacitor circuit, and wherein the capacitor circuit includes the capacitor. The computer-readable data storage device further includes instructions that, when executed, configure one or more processors of the data storage device to control the capacitor circuit to cause the capacitor to provide power to circuitry associated with memory devices of the data storage device along with power provided by a host device operably connected to the data storage device.

The details of one or more examples are set forth in the accompanying drawings and the description below. Other features, objects, and advantages will be apparent from the description and drawings, and from the claims.

DETAILED DESCRIPTION

In general, this disclosure describes techniques implemented by a processor of a controller of a data storage device to utilize energy stored by a capacitor of the data storage device to provide energy to the data storage device in parallel with energy from a host device to increase performance of the data storage device. In some examples, the data storage device is a solid state drive (SSD). The processor may determine that a voltage level of a capacitor in a capacitor circuit in the data storage device is above a threshold voltage value. The voltage level may represent energy stored by the capacitor, and the threshold voltage value may represent energy used to protect against a power loss imminent (PLI) event. A PI event may also be referred to as an Emergency Power Off (EPO) event in other devices. In either a PLI event or an EPO event, the solid state drive may lose power from its power source. To prevent the loss of data stored in volatile memory during PLI or EPO events, the capacitor may release energy to write the data from volatile memory to non-volatile memory. If the capacitor stores more than enough energy to protect against PLI or EPO events, the processor may use the excess energy stored by the capacitor to boost performance.

The processor may control a capacitor circuit that includes the capacitor to cause the capacitor to provide power to circuitry associated with memory devices of the data storage device along with power provided by a host device operably connected to the data storage device. In this way, the capacitor may provide additional power to the circuitry associated with memory devices of the data storage device. This additional power may allow the circuitry associated with memory devices of the data storage device to perform additional operations, such as read or write operations, which may boost performance of the data storage device.

Figure 1:
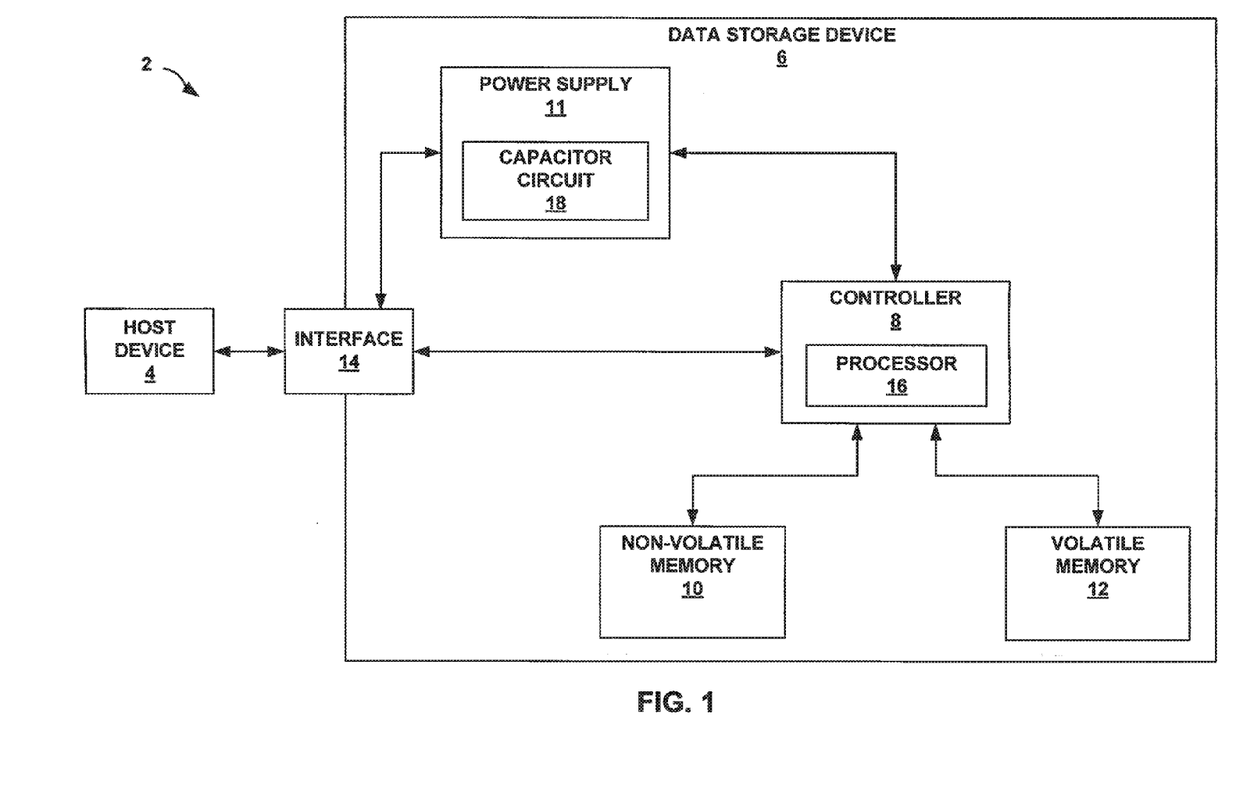
FIG. 1 is a conceptual block diagram illustrating an example storage environment in which a data storage device may function as a storage device for a host device, in accordance with one or more techniques of this disclosure.

FIG. 1 is a conceptual block diagram illustrating an example storage environment 2 in which data storage device 6 may function as a storage device for a host device 4, in accordance with one or more techniques of this disclosure. For instance, host device 4 may utilize non-volatile memory devices included in data storage device 6 to store and retrieve data. In some examples, storage environment 2 may include a plurality of storage devices, such as data storage device 6, which may operate as a storage array. For instance, storage environment 2 may include a plurality of storages devices 6 configured as a redundant array of inexpensive/independent disks (RAID) that collectively function as a mass storage device for host device 4. Data storage device 6 may be, for example, a solid state drive (SSD), a hybrid drive, which includes both solid state memory and magnetic media, or the like.

Storage environment 2 may include host device 4 which may store and/or retrieve data to and/or from one or more storage devices, such as data storage device 6. As illustrated in FIG. 1, host device 4 may communicate with data storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming devices, and the like. Typically, host device 4 comprises any device having a processor, which may refer to any form of hardware capable of processing data and may include a general purpose processing unit, such as a central processing unit (CPU), dedicated hardware (such as an application specific integrated circuit (ASIC)), configurable hardware such as a field programmable gate array (FPGA) or any other form of processing unit configured by way of software instructions, microcode, firmware or the like.

As illustrated in FIG. 1, data storage device 6 may include controller 8, non-volatile memory 10 (NVM 10), power supply 11, volatile memory 12, interface 14, and capacitor circuit 18. In some examples, data storage device 6 may include additional components not shown in FIG. 1 for sake of clarity. For example, data storage device 6 may include a printed circuit board (PCB) to which components of data storage device 6 are mechanically attached and which includes electrically conductive traces that electrically interconnect components of data storage device 6, or the like. In some examples, the physical dimensions and connector configurations of data storage device 6 may conform to one or more standard form factors. Some example standard form factors include, but are not limited to, 3.5" hard disk drive (HDD) or solid state drive (SSD), 2.5" HDD or SSD, 1.8" HDD) or SSD, peripheral component interconnect (PCI), PCI-extended (PCI-X), PCI Express (PCIe) (e.g., PCIe x1, x4, x8, x16, PCIe Mini Card, MiniPCI, etc.). In some examples, data storage device 6 may be directly coupled (e.g., directly soldered) to a motherboard of host device 4.

Data storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA) and parallel-FAT (PATA)), Fibre Channel Arbitrated Loop (FC-AL), small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit data storage device 6 to receive power from host device 4. For example, as illustrated in FIG. 1, power supply 11 may receive power from host device 4 via interface 14.

Data storage device 6 may include volatile memory 12, which may be used by controller 8 to temporarily store information. In some examples, controller 8 may use volatile memory 12 as a cache. For instance, controller 8 may store cached information in volatile memory 12 until the cached information is written to NVM 10. Volatile memory 12 may consume power received from power supply 11 to maintain the data stored in volatile memory 12. In a power loss interrupt (PLI) event or an EPO event, controller 8 may consume power received from capacitor circuit 18 to write the data temporarily stored in volatile memory 12 to NVM 10. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3 L, LPDDR3, DDR4, and the like)).

In some examples, NVM 10 may include any type of non-volatile memory devices. Some examples of NVM 10 include, but are not limited to, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

In some examples, NVM 10 may include flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks which may be divided into a plurality of pages. Each block of the plurality of blocks within a particular memory device may include a plurality of NAND cells. Rows of NAND cells may be electrically connected using a word line to define a page of a plurality of pages.

Data storage device 6 may include power supply 11, which may provide power to one or more components of data storage device 6. When operating in a standard mode, power supply 11 may provide power to the one or more components using power provided by an external device, such as host device 4. For instance, power supply 11 may provide power to the one or more components using power received from host device 4 via interface 14. Host device 4 may have a power threshold, known as a drive power limit, that limits the power that host device 4 can provide to data storage device 6. The protocol by which data storage device 6 and host device 4 connect and communicate may define this power threshold.

In some examples, power supply 11 includes capacitor circuit 18. Capacitor circuit 18 may include one or more energy storage components configured to provide power to the one or more components when operating in a shutdown mode, such as when power ceases to be received from host device 4. In this way, capacitor circuit 18 may function as an onboard backup power source. In a PLI event or an EPO event, host device 4 may cease to provide power to data storage device 6, and capacitor circuit 18 may provide power to preserve any data stored in volatile memory 12 by providing power to controller 8 to write data from volatile memory 12 to NVM 10.

Some examples of the one or more power storage components in capacitor circuit 18 include, but are not limited to, capacitors, super capacitors, batteries, and the like. In some examples, the amount of energy that may be stored in capacitor circuit 18 by the one or more power storage components may be a function of the cost and/or the size (e.g., area/volume) of the one or more power storage components. In other words, as the amount of energy stored by the one or more power storage components increases, the cost and/or the size of the one or more power storage components also increases. In some examples, the capacitors in capacitor circuit 18 may have capacitances in the range of two hundred to four hundred microfarads.

In some examples, capacitor circuit 18 may store more energy than that used to write the data stored in volatile memory 12 to NVM 10 during a PLI event or an EPO event. Capacitor circuit 18 may store extra energy to provide boost power to controller 8 or processor 16 for executing bursts of memory operations.

Data storage device 6 includes controller 8, which may manage one or more operations of data storage device 6. For instance, controller 8 may manage the reading of data from and/or the writing of data to NVM 10 or volatile memory 12. In some examples, controller 8 may manage the reading of data from and/or the writing of data to NVM 10 or volatile memory 12 by exchanging signals with NVM 10 or volatile memory 12. As discussed above, controller 8 may exchange signals with NVM 10 or volatile memory 12 in accordance with a communication protocol.

Controller 8 includes processor 16, which may be configured to determine a voltage level of a capacitor in capacitor circuit 18. For example, processor 16 may be configured to determine whether a voltage level of a capacitor in capacitor circuit 18 is above a threshold voltage value. Processor 16 may compare the voltage level of the capacitor to a threshold voltage value, plus an optional buffer amount, using a comparator or another device or circuit. The optional buffer amount may provide a safety factor to ensure that the voltage level of the capacitor does not fall below the threshold voltage value when the capacitor is controlled by processor 16 to provide energy to controller 8 in the absence of a PLI event or EPO event.

The threshold voltage value may be a preset value within processor 16. Processor 16 may select the threshold voltage value to ensure that capacitor circuit 18 stores enough energy to preserve data during a PLI event or an EPO event. The threshold voltage value may represent the maximum energy, or worst-case scenario, that data storage device 6 would need to commit data in volatile memory 12 to NVM 10 in event of a PLI event or an EPO event.

Processor 16 may adjust the threshold voltage value based on factors such as temperature, age, and power-on hours of capacitor circuit 18. The capacitors in capacitor circuit 18 may store reduced energy as the capacitor ages depending on many factors, including the loading and unloading of electrical energy, especially high currents into and out of capacitor circuit 18. The energy reduction rate of capacitor circuit 18 may increase depending on the number of hours that data storage device 6 is operational. In addition, the energy reduction rate may increase if capacitor circuit 18 experiences high temperatures.

Processor 16 may control the capacitor circuit to cause the capacitor to provide power to circuitry associated with memory devices along with power provided by host device 4. Capacitor circuit 18 may store more than enough energy to write data to NVM 10 in a PLI event. Processor 16 may use the excess energy in capacitor circuit 18 to provide power for bursts of memory operations when the voltage level across capacitor circuit 18 exceeds the threshold voltage value. In some examples, processor 16 may initiate boost power from capacitor circuit 18 only if the voltage level across capacitor circuit 18 exceeds the threshold voltage value plus an optional buffer amount. The buffer amount may represent a minimum energy, or a greater amount of energy, that capacitor circuit 18 may output when capacitor circuit 18 provides boost power to controller 8. The buffer amount may protect against the voltage level across capacitor circuit 18 declining below the threshold voltage value during the boost-power period, and may allow boost power to be provided for a predetermined amount of time without the voltage level across capacitor circuit 18 declining below the threshold voltage value.

In some examples, controller 8 may not have sufficient power to execute all of the requested memory operations. Controller 8 may need additional power to execute a large number of write operations, for example. In such a situation, controller 8 could increase performance except controller 8 is constrained by the power limits that the physical connection with host device 4 imposes. In some examples, capacitor circuit 18 may store excess energy above the energy that controller 8 needs for a PLI event or an EPO event (e.g., the voltage level may be above the threshold voltage level). Thus, processor 16 may direct capacitor circuit 18 to release some of the excess energy to increase the power supply to controller 8 for memory operations. As a result, data storage device 6 may experience increased performance when using the excess energy in capacitor circuit 18.

In some examples, processor 16 may monitor a voltage level of a capacitor in capacitor circuit 18. Processor 16 may compare this voltage level to a threshold voltage value. Processor 16 may select a threshold voltage level based on an amount of energy that processor 16 needs for a PLI event or an EPO event. In some examples, processor 16 may compare the voltage level of the capacitor to the threshold voltage level plus, optionally, a buffer amount or safety factor. The buffer amount or safety factor may be a voltage in addition to the voltage utilized for a PLI event or an EPO event. The buffer amount may prevent the energy in capacitor circuit 18 from declining below the energy needed for a PLI event or an EPO event.

In response to determining that the voltage level in capacitor circuit 18 is above the threshold voltage value, plus, in some examples, an optional buffer amount, processor 16 may cause capacitor circuit 18 to provide energy to controller 8. Controller 8 may use this energy to increase the execution of read operations or write operations during the time that capacitor circuit 18 is supplying this energy.

Processor 16 may continue to monitor the voltage level in capacitor circuit 18, and processor 16 may cause capacitor circuit 18 to cease providing energy before the voltage level in capacitor circuit 18 declines to below the threshold voltage value.

The techniques described herein may provide boost power to controller 8 for executing memory operations, and controller 8 thus may increase its performance above a host-power-constrained performance level. By maintaining sufficient energy in capacitor circuit 18 for a PLI event or an EPO event, processor 16 ensures that any data in volatile memory 12 is safe. In this way, processor 16 may use the excess energy in capacitor circuit 18, which would not normally serve any function, to boost performance.

Figure 2:
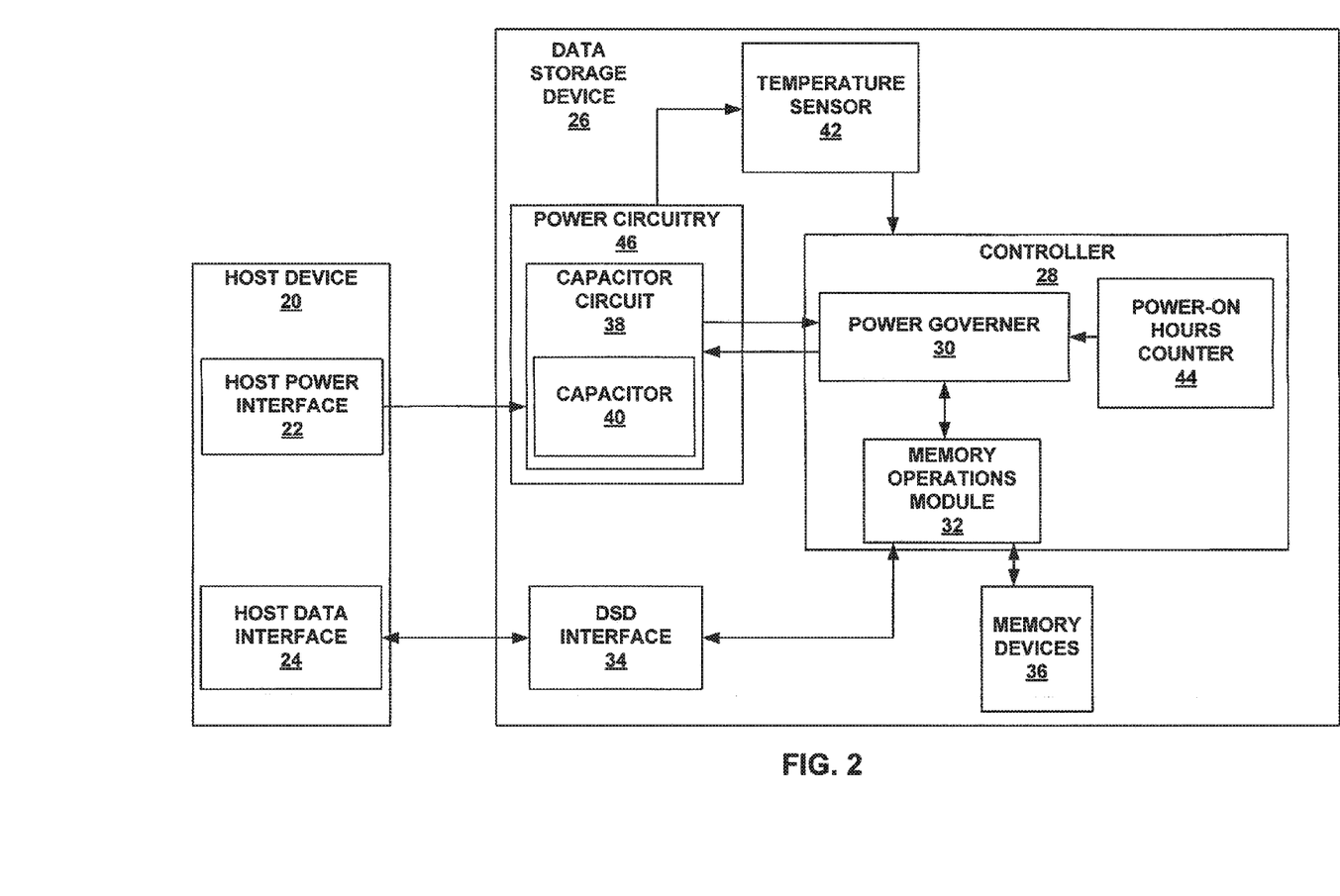
FIG. 2 is a conceptual block diagram illustrating a data storage device and a host device, in accordance with one or more techniques of this disclosure.

FIG. 2 is a conceptual block diagram illustrating a data storage device 26 and a host device 20, in accordance with one or more techniques of this disclosure. FIG. 2 illustrates the relationship between the components of data storage device 26 and host device 20. In some examples, host device 20 is similar to or substantially the same as host device 4 of FIG. 1, and data storage device 26 is similar to or substantially the same as data storage device 6 in FIG. 1.

Host device 20 may include host power interface 22 and host data interface 24. Host device 20 may provide a power input to power circuitry 46 of data storage device 26 via host power interface 22. In some examples, the power input from host device 20 via host power interface 22 may be variable, having different levels for sleep mode, idle conditions, and active operations. In some examples, host power interface 22 may have a maximum power limit that host power interface 22 may provide to power circuitry 46. The protocol according to which host device 20 connects to data storage device 26 may define the maximum power limit, known as a drive power limit, which may be, for example, nine watts, eleven watts, fifteen watts, or twenty watts.

Host device 20 may be operably connected to data storage device 26 so that host device 20 exchanges data with data storage device 26 through host data interface 24 and data storage device (DSD) interface 34. Host device 20 may request memory operations from data storage device 26 via host data interface 24 and DSD interface 34. If host device 20 requests a memory operation from data storage device 26, host data interface 24 may send the request to DSD interface 34. DSD interface 34 may forward the request to memory operations module 32 of controller 28. Memory operations module 32 may read data from and write data to memory devices 36 and transmit data to host data interface 24 via DSD interface 34.

Before performing a memory operation on memory devices 36, memory operations module 32 may send a request for a memory operation to power governor 30. In some examples, the request for a memory operation may be a NAND operation request because, in some examples, data storage device 26 may include one or more NAND arrays within memory devices 36. Power governor 30 may assess whether sufficient power is available to data storage device 26 to execute the requested memory operation. If power governor 30 determines that there is sufficient power available to execute the memory operation, power governor 30 may permit memory operations module 32 to execute the memory operation. When the memory operation is complete, memory operations module 32 may send a completion notification to power governor 30. Power governor 30 may be implemented in software, firmware, or hardware within controller 28.

In some examples, power governor 30 may not actively monitor actual power consumption by memory operations module 32 and memory devices 36. Instead, power governor 30 may track the requests and completion notifications from memory operations module 32. Power governor 30 may count the number of credits that are active in memory devices 36, where each credit may represent an amount of power usage by memory operations module 32. In some examples, a write operation may correspond to more credits than a read operation, as a write operation may consume more power than a read operation.

If power governor 30 determines that the number of active credits is below the credit limit (i.e., power limit) for data storage device 26, power governor 30 may permit requests for new memory operations. In contrast, if the number of active credits is at or above the credit limit for data storage device 26, power governor 30 may not permit requests for new memory operations. Power governor 30 may compare credits to the credit limit to ensure that memory operations module 32 and memory devices 36 do not exceed the power limit for data storage device 26.

Data storage device 26 includes a capacitor circuit 38, which includes a capacitor 40 that stores energy for use during a PLI event or an EPO event. Capacitor 40 may include a single capacitor or a bank of capacitors connected in parallel. In some examples, capacitor 40 may store energy in excess of the energy required during a PLI event or an EPO event. For example, capacitor 40 may have an initial capacitance value (when new) that is in excess of the capacitance required during a PLI event or an EPO event, which allows the capacitance of capacitor 40 to degrade over time due to aging without resulting in capacitor 40 storing insufficient energy to cope with a PLI event or an EPO event.

In some examples, power governor 30 may monitor the energy that is available from capacitor 40. Power governor 30 may receive a signal from capacitor circuit 38 indicating the voltage across capacitor 40 within capacitor circuit 38. The relationship between the energy stored by capacitor 40 and the voltage across capacitor 40 may be $U=\frac{1}{2}CV^2$, where U is the energy stored by capacitor 40, C is the capacitance of capacitor 40, and V is the voltage across capacitor 40.

Capacitor 40 may store energy to mitigate the effect of a PLI event by allowing memory operations module 32 to write data from volatile memory to non-volatile memory before total loss of power to data storage device 26. Power governor 30 may determine the amount of energy that capacitor circuit 38 needs for a PLI event. Using the equation for energy, capacitance, and voltage stated above, the threshold voltage value may correspond to the amount of energy that capacitor circuit 38 may need for a PLI event. In some examples, power governor 30 may couple the threshold voltage value to an optional buffer voltage amount above the amount of energy that capacitor circuit 38 may need for a PLI event. If the voltage of capacitor 40 is greater than the threshold voltage value, plus the optional buffer amount, power governor 30 may determine that additional energy is available from capacitor circuit 38 for memory operations 32. Therefore, power governor 30 may cause capacitor circuit 38 to provide energy to controller 28, which may allow controller 28 (e.g., memory operations module 32) to exceed the power limit for data storage device 26 using energy from capacitor 40.

For example, in response to a request by memory operations module 32 for a new memory operation, power governor 30 may compare the number of active credits plus the credits associated with the new memory operation request, with the power limit for data storage device 26 (as measured in credits). If the sum of the active credits plus the credits for the new memory operation request exceeds the maximum allowable credits, as defined by the power limit for data storage device 26, power governor 30 may determine if there is sufficient energy stored by capacitor 40 (e.g., as measured in credits) to support performance of the requested memory operation. The capacitor credits may correspond to the excess energy, if any, stored by capacitor 40. In response to determining that there are sufficient capacitor credits, power governor 30 may transmit a boost enable signal to capacitor circuit 38 to cause capacitor circuit 38 to provide power to controller 28 (e.g., memory operations module 32). Power governor 30 may also provide permission to memory operations module 32 to execute the new memory operation.

Figure 3:
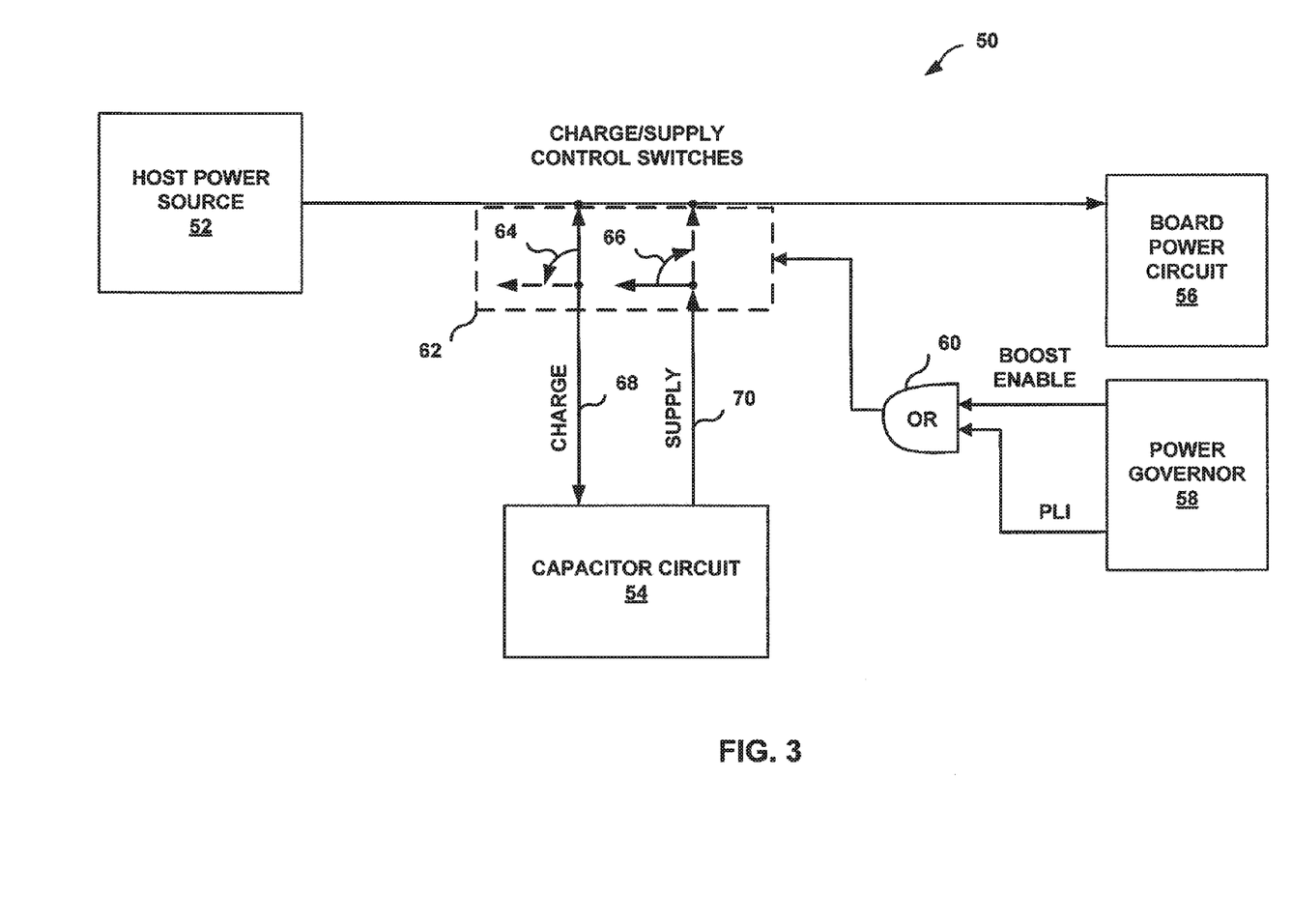
FIG. 3 is a conceptual block and circuit diagram illustrating an example data storage device that includes a power governor configured to control a capacitor circuit to store power or provide boost power, in accordance with one or more techniques of this disclosure.

FIG. 3 is a conceptual block and circuit diagram illustrating an example data storage device 50 that includes a power governor 58 configured to control a capacitor circuit 54 to store power or provide boost power, in accordance with one or more techniques of this disclosure. Data storage device 50 includes capacitor circuit 54, board power circuit 56, and power governor 58. Board power circuit 56 may receive power from host power source 52. In some examples, host power source 52 may provide power up to a maximum power limit, which may be defined by the protocol according to which host power source 52 connects to data storage device 50. The maximum power limit may constrain the performance of data storage device 50 during high workloads.

Power governor 58 may control capacitor circuit 54 to provide power to board power circuit 56 in instances in which the workload of data storage device 50 exceeds the maximum power provided host power source 52. Logic gate 60 represents two types of events that may result in power governor 58 directing capacitor circuit 54 to provide additional power to board power circuit 56. In a first example, power governor 58 may determine that the voltage level of capacitor circuit 54 exceeds a threshold voltage value, plus, in some examples, an optional buffer amount. If the workload of data storage device 50 would consume power that exceeds the maximum power limit from host power source 52, power governor 58 may control capacitor circuit 54 by sending a boost enable signal, also known as a control signal, to cause capacitor circuit 54 to provide power to board power circuit 56. In a second example, during a PLI event, power governor 58 may control capacitor circuit 54 to provide power to board power circuit 56 to allow controller 28 (FIG. 2) to write data stored in volatile memory (e.g., volatile memory 12 of FIG. 1) to non-volatile memory (e.g., non-volatile memory 10 of FIG. 1).

Power governor 58 may control capacitor circuit 54 to cause a capacitor within capacitor circuit 54 to provide power to board power circuit 56 by controlling charge/supply control switches 62. For example, power governor 58 may cause supply control switch 66 to close to connect capacitor circuit 54 to board power circuit 56 via supply line 70. This may allow capacitors in capacitor circuit 54 to provide power to board power circuit 56, e.g., for use by controller 28 (FIG. 2) for issuing NAND operations.

In response to power governor 58 determining that controller 28 no longer needs boost power or the voltage of capacitor has reduced below a predetermined threshold voltage, power governor 58 may cause supply control switch 66 to open, thereby disconnecting supply line 70 and ceasing provision of power from capacitor circuit 54 to controller 28 via board power circuit 56. Board power circuit 56 may no longer need boost power if the workload of data storage device 50 is reduced, such that power consumption of data storage device 50 drops below the maximum power limit provided by host power source 52.

Power governor 58 also may control charge/supply control switches 62 to store additional energy in capacitor circuit 54 in response to power governor 58 determining that capacitor circuit 54 contains less energy than a maximum energy capacity of capacitor circuit 54 and is not currently being used to provide boost power to board power circuit 56. In some examples, power governor 58 may also determine that the workload of data storage device 50 is sufficiently low that data storage device 50 is currently consuming less power than the maximum power limit before causing additional energy to be stored in capacitor circuit 54. To cause energy to be stored in capacitor circuit 54, power governor 58 may cause charge control switch 64 to close to connect capacitor circuit 54 to host power source 52 via charge line 68. In response to power governor 58 determining that capacitor circuit 54 can store no additional energy, or that controller 28 may be able to utilize additional power (e.g., boost power), power governor 58 may cause charge control switch 64 to open, thereby disconnecting charge line 68 from host power source 52 and ceasing charging of capacitor circuit 54.

In some examples, power governor 58 may control charge/supply control switches 62 based on past events, also known as hysteresis. For example, power governor 58 may cause charge control switch 64 to close to store energy in capacitor circuit 54. Power governor 58 may not cause charge control switch 64 to open for several milliseconds or longer after causing charge control switch 64 to close. In this way, power governor 58 may reduce the open and close signals that power governor 58 sends to charge/supply control switches 62. Power governor 58 may reduce the signals to avoid rapidly toggling charge/supply control switches 62 back or forth.

In some examples, power governor 58 may control charge/supply control switches 62 based on different thresholds for charging and discharging capacitor circuit 54. For example, power governor 58 may switch charge/supply control switches 62 from charge to discharge only after determining that a capacitor in capacitor circuit 54 has a voltage above a discharge threshold voltage value. On the other hand, power governor 58 may switch charge/supply control switches 62 from discharge to charge only after determining that the voltage of the capacitor in capacitor circuit 54 has decreased below a charge threshold voltage value. The discharge threshold voltage value may be greater than the charge threshold voltage value, and both the discharge threshold voltage value and the charge threshold voltage value may be greater than or equal to the threshold voltage value that corresponds to the energy from the capacitor that is utilized in a PLI event. In this way, power governor 58 may reduce the open and close signals that power governor 58 sends to charge/supply control switches 62.

Returning to FIG. 2, in some examples, the threshold voltage value associated with capacitor 40 may change as capacitor 40 ages. Power governor 30 may adjust the threshold voltage value based on, for example, signals or information from temperature sensor 42, power-on hours counter 44, or the like. If temperature sensor 42 indicates that capacitor circuit 38 has experienced or is experiencing high temperatures, power governor 30 may increase the threshold voltage value. High temperatures may cause a weakening or breakdown of the dielectric within capacitor 40, thereby reducing the capacitance of capacitor 40. By increasing the threshold voltage value, power governor 30 may compensate for the reduced capacitance of capacitor 40, thereby ensuring that substantially the same amount of energy (e.g., the same amount of energy or nearly the same amount of energy) is still available from capacitor circuit 38 upon occurrence of a PLI. Similarly, if power-on hours counter 44 indicates that capacitor circuit 38 has surpassed a predetermined number of operating hours, power governor 30 may increase the threshold voltage value.

In some examples, power governor 30 may also determine the threshold voltage value based on the age of capacitor circuit 38 (independent of power-on hours). The capacitance of capacitor circuit 38 may decline as capacitor circuit 38 ages. In response, power governor 30 may increase the threshold voltage value after a predetermined time or gradually over time to compensate for the lower capacitance of capacitor circuit 38.

In this way, power governor 30 may control capacitor circuit 38 to release energy from or store energy to capacitor 40 based on at least one of capacitor voltage value 102, threshold voltage 100, power draw 86, power supply limit 84, or performance and workload 88, all of which will be subsequently defined in the descriptions of FIG. 4 and FIG. 5. For example, power governor 30 may control capacitor circuit 38 to release energy from capacitor 40 to provide additional power to memory operations module 32 to allow memory operations module 32 to perform additional memory operations compared to the number of memory operations memory operations module 32 can perform at power supply limit 84. In this way, excess energy stored by capacitor 40 may be utilized by controller 28 (e.g., memory operations module 32) to increase performance of data storage device 26.

Figure 4:
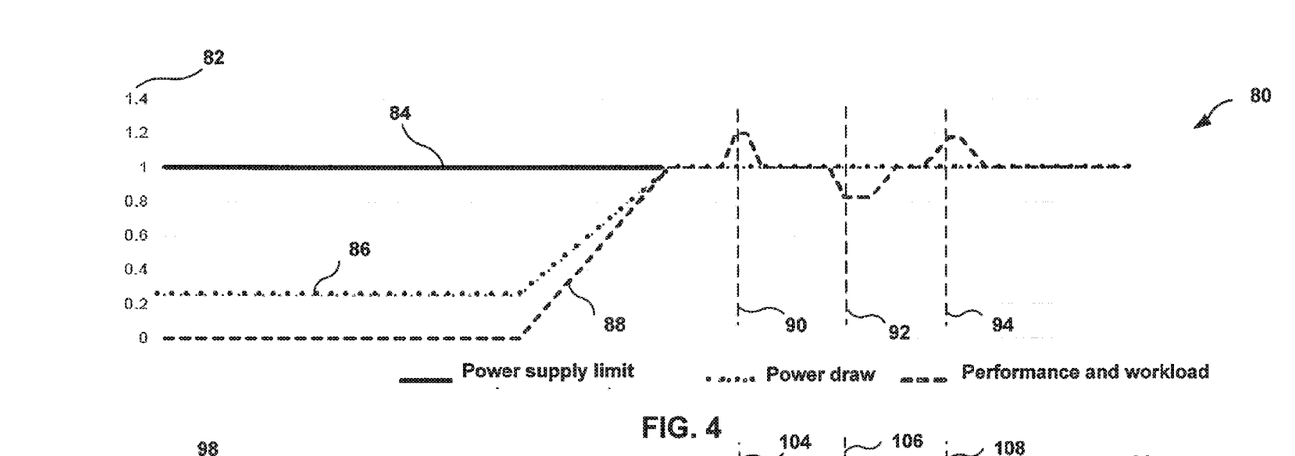
FIG. 4 is a graph of an example of performance and workload and power draw from host power interface as a function of time, in accordance with one or more techniques of this disclosure.

FIG. 4 is a graph 80 of an example of performance and workload 88 and power draw 86 from host power interface 22 (FIG. 2) as a function of time, in accordance with one or more techniques of this disclosure. FIG. 4 will be described with concurrent reference to the system illustrated in FIG. 2. The horizontal axis of graph 80 is time, and the vertical axis 82 is relative (or normalized) power and relative (or normalized) performance. A relative power magnitude of 1.0 on vertical axis 82 represents the power supply limit 84 for host interface 22 to supply data storage device 26, and a relative performance magnitude of 1.0 on vertical axis represents performance of data storage device 26 at maximum power draw from host power interface 22. Power draw 86 represents the power that host power interface 22 supplies to data storage device 26 as a function of time. Performance and workload 88 represents the performance of data storage device 26 in executing memory operations (e.g., NAND operations).

Figure 5:
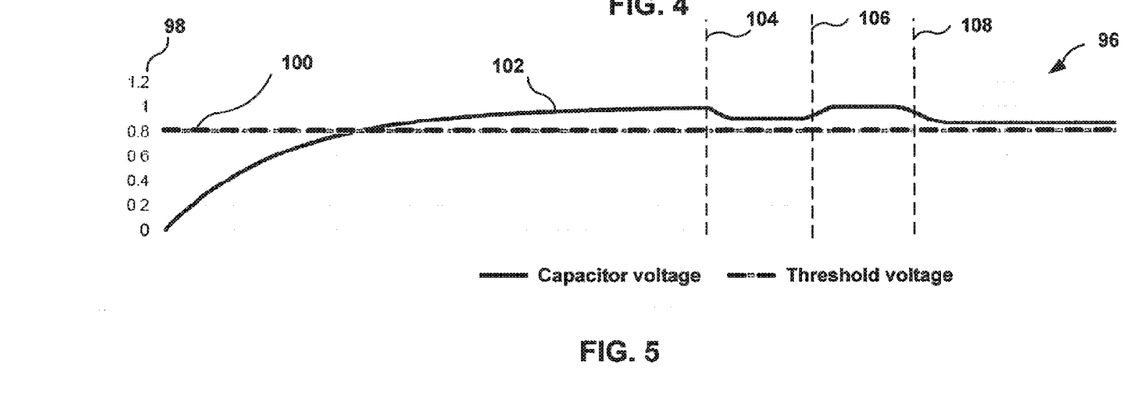
FIG. 5 is a graph of an example of capacitor voltage in a capacitor as a function of time, in accordance with one or more techniques of this disclosure

FIG. 5 is a graph 96 of an example of capacitor voltage 102 in a capacitor 40 as a function of time, in accordance with one or more techniques of this disclosure. FIG. 5 will be described with concurrent reference to the system illustrated in FIG. 2 and graph 80 of FIG. 4. The horizontal axis of graph 96 is time, and the vertical axis 98 is relative (or normalized) energy. An energy magnitude of 1.0 on vertical axis 98 represents a maximum energy storage capacity for capacitor circuit 38 (e.g., capacitor 40). An energy magnitude of 0.8 on vertical axis 98 may represent a threshold voltage value 100 for capacitor circuit 38 in the example of FIG. 5.

Time 90 in graph 80 corresponds to time 104 in graph 96. Leading up to time 104 in FIG. 5, capacitor voltage 102 of capacitor 40 is increasing to near the maximum storage capacity of capacitor 40. Just before time 90 in FIG. 4, performance 88 is equal to full performance when host power interface 22 is providing power substantially equal to maximum power limit 84. When performance 88 is equal to full performance at power supply limit 84, performance 88 may be power limited by the power available from host power interface 22. At times 90 and 104, power governor 30 causes capacitor circuit 38 to provide power, which is utilized by memory operations module 32 and memory devices 36 to increase performance 88 to exceed the full performance at power supply limit 84. This allows memory operations module 32 and memory devices 36 to execute more memory operations, represented by the increase in performance and workload 88. As capacitor 40 is providing power to memory operations module 32 and memory devices 36 at time 104, capacitor voltage 102 declines.

In some examples, time 90 and time 104 may correspond to controller 28 (e.g., memory operations module 32) executing a burst of write operations. In some examples, controller 28 (e.g., memory operations module 32) may organize or arrange an order of execution for read operations and write operations by separating the read operations from the write operations, and grouping a plurality of write operations to be executed sequentially and, separately, a plurality of read operations to be executed sequentially. In some data storage devices, such as SSDs, writes may consume more power than reads, e.g., due to the techniques used to read and write data. Thus, by grouping write operations together, controller 28 may execute higher power operations in series or sequentially, using boost power to increase performance and workload during the higher-power write operations above the performance when host power interface 22 is providing power at power supply limit 84. Power governor 30 may cause capacitor circuit 38 to provide power to memory operations module 32 and memory devices 36 while memory operations module 32 and memory devices 36 are executing a group of consecutive write operations. In contrast, during the execution of a group of read operations (which are lower-power operations), power governor 30 may cause capacitor circuit 38 to cease providing power to controller 28, and may instead cause capacitor circuit 38 to charge capacitor 40 using power provided by host power interface 22. In this way, in some examples, controller 28 may group similar types of memory operations to more efficiently use capacitor voltage 102.

As shown in FIG. 4, after time 90 and before time 92, performance and workload 88 drops. As shown in FIG. 5, at the same time (after time 104 and before time 106), capacitor voltage 102 stops declining, indicating that power governor 30 has caused capacitor circuit 38 cease providing power to controller 28, including memory operations module 32. As such, without the additional boost power provided by capacitor 40, performance and workload 88 is no longer able to exceed the performance and workload when host power interface 22 is providing power at power supply limit 84, and decreases so that performance and workload 88 is at the performance and workload when host power interface 22 is providing power at power supply limit 84.

At time 92, performance and workload 88 drops below the performance and workload when host power interface 22 is providing power at power supply limit 84. Because of this, not all power provided by host power interface 22 is used for executing memory operations, and power governor 30 may cause capacitor circuit 38 to charge capacitor 40 by consuming power from host power interface 22, as shown beginning at time 106 in FIG. 5. Once capacitor 40 is fully charged, as indicated by capacitor voltage 102 reaching approximately 1 on FIG. 5, power governor 30 may cause capacitor circuit 38 to cease charging capacitor 40 using power from host power interface 22, and this power may be available to controller 28 to execute memory operations, as indicated by the increase in performance and workload 88 between times 92 and 94. In some examples, power governor 30 may cause capacitor circuit 38 to charge capacitor 40 using power from host power interface 22 at times at which controller 28 (e.g., memory operations module 32) is performing a series of read operations, as read operations may utilize less power than write operations.

At time 94 in graph 80 and time 108 in graph 96, power governor 30 may determine that memory operations module 32 and memory devices 36 could execute more memory operations with more power, e.g., that performance of memory operations module 32 and memory devices 36 are limited by power supply limit 84. Additionally, power governor 30 may determine that capacitor voltage 102 is above threshold voltage 100. Power governor 30 then may cause capacitor circuit 38 to supply power to controller 28, including memory operations module 32. As shown in FIG. 4, at time 94, performance and workload 88 may exceed the performance and workload at power supply limit 84 because capacitor circuit 38 is providing power to memory operations module 32 for executing memory operations. Simultaneously, at time 108, capacitor voltage 102 declines as capacitor circuit 38 releases energy. Power governor 30 may prevent capacitor voltage 102 from declining below threshold voltage value 100 by causing capacitor circuit 38 to cease providing boost power before capacitor voltage 102 is reduced below threshold voltage value 100.

In this way, power governor 30 may control capacitor circuit 38 to release energy from or store energy to capacitor 40 based on at least one of capacitor voltage value 102, threshold voltage 100, power draw 86, power supply limit 84, or performance and workload 88. For example, power governor 30 may control capacitor circuit 38 to release energy from capacitor 40 to provide additional power to memory operations module 32 to allow memory operations module 32 to perform additional memory operations compared to the number of memory operations memory operations module 32 can perform at power supply limit 84. In this way, excess energy stored by capacitor 40 may be utilized by controller 28 (e.g., memory operations module 32) to increase performance of data storage device 26.

Figure 6:
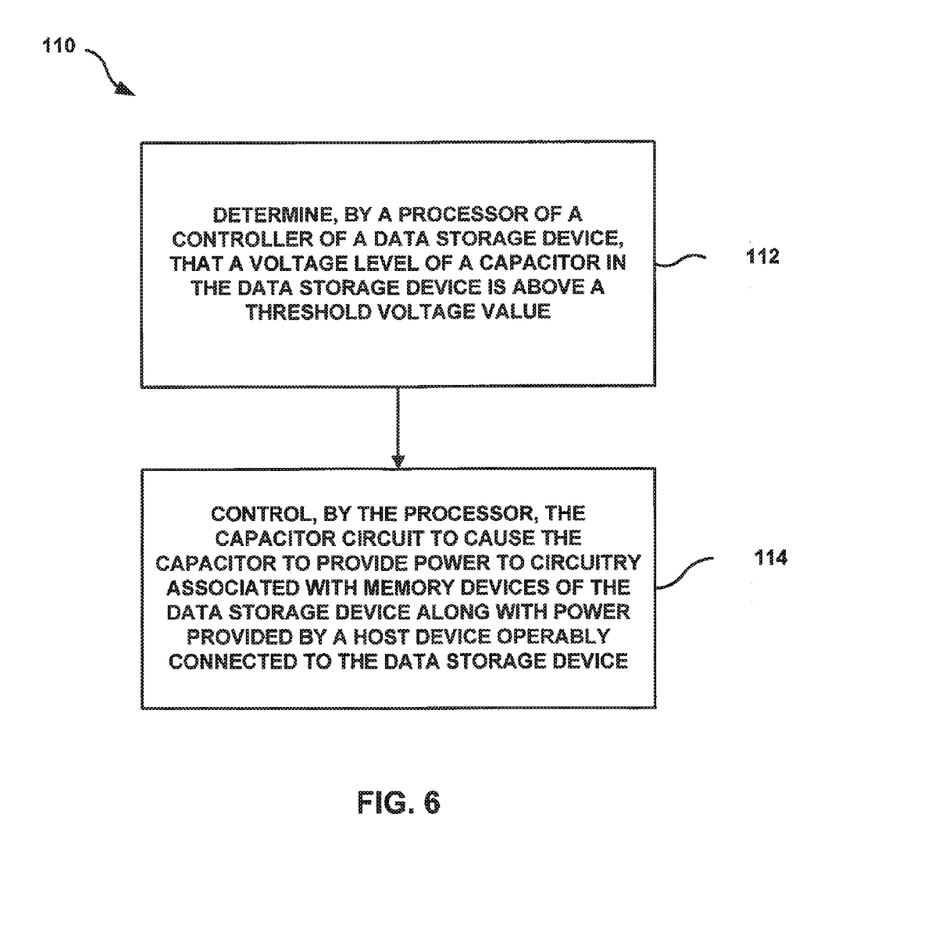
FIG. 6 is a flowchart illustrating an example technique according to which a processor may cause a capacitor circuit 38 to provide boost power, in accordance with one or more techniques of this disclosure.

FIG. 6 is a flowchart illustrating an example technique according to which a processor may cause a capacitor circuit 38 to provide boost power, in accordance with one or more techniques of this disclosure. Technique 110 is described with respect to the system of FIG. 2, including power governor 30, although other components, such as processor 16 in FIG. 1 or power governor 58 in FIG. 3, may perform similar techniques.

The technique of FIG. 6 includes determining, by power governor 30, that a voltage level of capacitor 40 within capacitor circuit 38 of data storage device 26 is above a threshold voltage value (112). The threshold voltage value may correspond to the amount of energy that data storage device 26 may need to write data from volatile memory to non-volatile memory during a PLI event. In some examples, power governor 30 may add an optional buffer amount to the threshold voltage value and compare the voltage level of capacitor 40 to the threshold voltage value plus the buffer amount. The buffer amount may ensure that the voltage level of capacitor 40 does not decline below the threshold voltage value.

The technique of FIG. 6 also includes controlling, by power governor 30, capacitor circuit 38 to cause capacitor 40 to provide power to the circuitry associated with memory devices 36 through controller 28 (e.g., memory operations module 32) along with the power provided by host device 20 that is operably connected to data storage device 26 (114). The power provided by capacitor 40 may allow memory operations module 32 to process additional memory operations, which may increase the performance of memory devices 36 during high workloads. Power governor 30 may further control capacitor 40 to cease providing power before the voltage level across capacitor 40 declines below the threshold voltage value, in order to maintain sufficient energy in capacitor 40 to address any PLI event.

Figure 7:
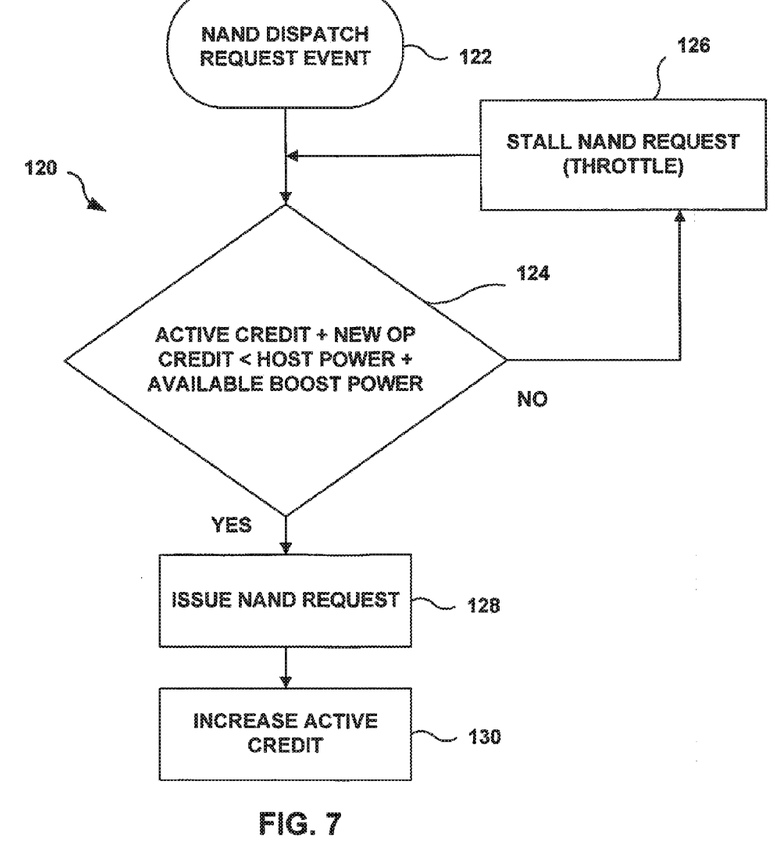
FIG. 7 is a flowchart illustrating an example technique implemented by a processor for determining when to control a capacitor circuit to provide boost power based on comparing the credits associated with memory operations to credits associated with host power and energy stored in a capacitor circuit, in accordance with one or more techniques of this disclosure.

FIG. 7 is a flowchart illustrating an example technique 120 implemented by a processor for determining when to control a capacitor circuit to provide boost power based on comparing the credits associated with memory operations to credits associated with host power and energy stored in a capacitor circuit 38, in accordance with one or more techniques of this disclosure. Technique 120 is described with reference to the system of FIG. 2, including power governor 30, although other components, such as processor 16 in FIG. 1 or power governor 58 in FIG. 3, may perform similar techniques.

The technique of FIG. 7 includes receiving, by power governor 30, a NAND dispatch request event (122). The NAND dispatch request event may be a new request for memory operations received by data storage device 26 from host device 20. Power governor 30 may associate the new request to an amount of power, also known as a power cost, that memory devices 36 may require to execute the new request. Each type of NAND dispatch or memory operation may be associated with a predetermined power cost, which also may be referred to as a power credit. Power governor 30 may track a number of active power credits, which refers to a number of power credits associated with NAND dispatches that power governor 30 has authorized and for which power governor 30 has not received a NAND completion event notification. In some examples, the new request may relate to memory devices 36 such as a NOR array or a hard disk drive, instead of a NAND array.

Power governor 30 may determine whether the number of active power credits plus the power credits associated with the new request is less than a total number of possible credits, which is based on power credits due to the host power provided by host power interface 22 plus the number of power credits due to available boost power from capacitor 40 (124). Power governor 30 may determine the available boost power by monitoring the voltage level across capacitor 40 and subtracting the threshold voltage value, then converting this voltage value to a number of power credits. Instead of measuring power consumption of memory devices 36, power governor 30 may track active power credits as described further in step 130 and step 144 in FIG. 8. The power available from host device 20 plus the available boost power from capacitor circuit 38 may be equal to the total available power, measured as a total number of power credits.

In response to determining that the number of active power credits plus the power credits associated with the new request is greater than the number of power credits associated with host power interface 22 plus the number of power credits associated with boost power available from capacitor 40 (the "NO" branch of decision block 124), power governor 30 may stall, delay, or throttle, the NAND request (126). In this situation, there may not be sufficient power to execute the new request, given the current workload. Power governor 30 may therefore delay or suspend the new NAND request until the workload decreases.

In response to determining that the number of active power credits plus the power credits associated with the new request is less than the number of power credits associated with boost power available from capacitor 40 plus the number of power credits associated with host power interface 22 (the "YES" branch of decision block 124), power governor 30 may issue the NAND request (128). Power governor 30 may direct the approval of the NAND) request to memory operations module 32, which executes the NAND request and causes memory devices 36 to complete the NAND request.

Along with issuing the NAND request, power governor 30 may increase the active power credits that are associated with current memory operations (130). Power governor 30 may use the active power credits to determine the power consumption associated with the current memory operations (e.g., NAND dispatches that power governor 30 has authorized and for which power governor 30 has not received a NAND completion event notification).

Figure 8:
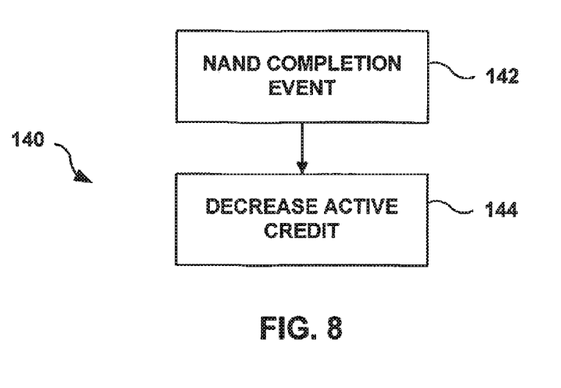
FIG. 8 is a flowchart illustrating an example technique implemented by a processor for completing a memory operation, in accordance with one or more techniques of this disclosure.

FIG. 8 is a flowchart illustrating an example technique 140 implemented by a processor for completing a memory operation, in accordance with one or more techniques of this disclosure. Technique 140 is described with reference to the system of FIG. 2, including power governor 30, although other components, such as processor 16 in FIG. 1 or power governor 58 in FIG. 3, may perform similar techniques.

The technique of FIG. 8 includes receiving, by power governor 30, a NAND completion event (142). When memory operations module 32 and memory devices 36 finish execution of a memory operation, memory devices 36 may send a notice of a NAND completion event to memory operations module 32, which communicates the NAND completion event to power governor 30, which receives the NAND completion event. The NAND completion event may correspond to reduced power consumption by memory operations module 32 and memory devices 36. In some examples, power governor 30 may receive the NAND completion event in step 142 concurrently with receiving other NAND dispatch request events in step 122 in FIG. 7.

Along with receiving notice of the NAND completion event, power governor 30 may decrease the active power credits count that is associated with current memory operations (144). Power governor 30 may use the active credits to determine the power consumption associated with the current memory operations.

Returning to FIG. 7, each time power governor 30 receives a NAND dispatch request event from memory operations module 32, power governor 30 may perform the technique of FIG. 7 and/or FIG. 8. In some examples, power governor 30 may perform a two-step comparison of the number of active power credits plus the power credits associated with the new request to threshold power credit values. For example, power governor 30 may first compare the number of active power credits plus the power credits associated with the new request to a number of power credits associated with power provided solely by host power interface 22. In response to determining that the number of active power credits plus the power credits associated with the new request is less than or equal to the number of power credits associated with power provided solely by host power interface 22, power governor 30 may issue the NAND operation request, and allow memory operations module 32 to control memory devices to perform the requested NAND operation.

However, in response to determining that the number of active power credits plus the power credits associated with the new request is greater than the number of power credits associated with power provided solely by host power interface 22, power governor 30 may compare the number of active power credits plus the power credits associated with the new request to the total number of possible credits, which is based on power credits due to the host power provided by host power interface 22 plus the number of power credits due to available boost power from capacitor 40 (124). In this way, the two-step comparison may allow power governor 30 to first determine whether boost power from capacitor 40 is needed to issue the NAND operation request, then to determine whether sufficient boost power is available to issue the NAND operation request.

The following examples may illustrate one or more of the techniques of this disclosure.

Example 1

A method includes determining, by a processor of a controller of a data storage device, that a voltage level of a capacitor in the data storage device is above a threshold voltage value, wherein the data storage device includes a capacitor circuit, and wherein the capacitor circuit includes the capacitor. The method further includes controlling, by the processor, the capacitor circuit to cause the capacitor to provide power to circuitry associated with memory devices of the data storage device along with power provided by a host device operably connected to the data storage device.

Example 2

The method of example 1, further including controlling, by the processor, the capacitor circuit to cease provision of power from the capacitor to prevent the voltage level of the capacitor from reaching a voltage level less than the threshold voltage value.

Example 3

The method of example 1 or 2, wherein controlling the capacitor circuit to cause the capacitor to provide power to the circuitry associated with memory devices of the data storage device includes: receiving, by the controller; a dispatch request event; determining, by the processor, a power cost of a number of active memory operations and a number of new memory operations; comparing, by the processor, the power cost of the number of active memory operations and the number of new memory operations to a total available power, wherein the total available power is a sum of power available from the capacitor while maintaining the voltage level of the capacitor above the threshold voltage value and power available from the host device; and in response to the power cost being less than the total available power, issuing, by the controller, the request.

Example 4

The method of any one of examples 1 to 3, further including increasing, by the processor, the threshold voltage value based at least in part on at least one characteristic of the capacitor circuit, wherein the at least one characteristic includes at least one of a temperature of the capacitor, an age of the capacitor, or a number of power-on hours for the capacitor circuit.

Example 5

The method of any one of examples 1 to 4, further including controlling, by the processor, the capacitor circuit to cause the capacitor to store power from a host device when a power cost of an amount of active memory operations is less than an amount of power available from the host device.

Example 6

The method of any one of examples 1 to 5, wherein the threshold voltage value is based on an amount of energy for writing data from volatile memory devices to non-volatile memory devices due to a power loss event.

Example 7

The method of any one of examples 1 to 6, further including comparing, by the controller, an amount of active memory operations to a drive power limit defined by an amount of power provided by a host device. The method further includes controlling, by the processor, the capacitor circuit to cause the capacitor to provide power to circuitry associated with memory devices in response to the amount of active memory operations being above the drive power limit and the voltage level of the capacitor being above the threshold voltage value.

Example 8

The method of any one of examples 1 to 7, further including organizing, by the controller based on a number of read operations and a number of write operations, an order of execution for the read operations and the write operations. The method further includes executing, by the controller, a number of consecutive write operations. The method further includes controlling, by the controller, the capacitor circuit to cause the capacitor to provide power to circuitry associated with memory devices while executing the number of consecutive write operations.

Example 9

A data storage device operably connected to a host device, the data storage device including: a controller including a processor, a capacitor circuit including a capacitor, and a plurality of memory devices. The processor is configured to determine that a voltage level of the capacitor is above a threshold voltage value and control the capacitor circuit to cause the capacitor to provide power to circuitry associated with the memory devices along with power provided by the host device.

Example 10

The device of example 9, wherein the processor is further configured to control the capacitor circuit to cease provision of power from the capacitor to prevent the voltage level of the capacitor from reaching a voltage level less than the threshold voltage value.

Example 11

The device of example 9 or 10, wherein the controller is further configured to receive a dispatch request event, and wherein the processor is further configured to determine a power cost of a number of active memory operations and a number of new memory operations. The processor is further configured to compare the power cost of the number of active memory operations and the number of new memory operations to a total available power, wherein the total available power is a sum of power available from the capacitor while maintaining the voltage level of the capacitor above the threshold voltage value and power available from the host device. The processor is further configured to issue, in response to the power cost being less than the total available power, the request.

Example 12

The device of any one of examples 9 to 11, wherein the processor is further configured to increase the threshold voltage value based at least in part on at least one characteristic of the capacitor circuit. The at least one characteristic includes at least one of a temperature of the capacitor, an age of the capacitor, or a number of power-on hours for the capacitor circuit.

Example 13

The device of any one of examples 9 to 12, wherein the processor is further configured to control the capacitor circuit to cause the capacitor to store power from a host device when a power cost of an amount of active memory operations is less than an amount of power available from the host device.

Example 14

The device of any one of examples 9 to 13, wherein the controller is further configured to execute a number of consecutive write operations and control the capacitor circuit to cause the capacitor to provide power to circuitry associated with memory devices while executing the number of consecutive write operations.

Example 15

A computer-readable data storage device including instructions that, when executed, configure one or more processors of a data storage device to determine that a voltage level of a capacitor in a data storage device is above a threshold voltage value, wherein the data storage device includes a capacitor circuit, and wherein the capacitor circuit includes the capacitor. The computer-readable data storage device further includes instructions that, when executed, configure one or more processors of the data storage device to control the capacitor circuit to cause the capacitor to provide power to circuitry associated with memory devices of the data storage device along with power provided by a host device operably connected to the data storage device.

Example 16

The computer-readable storage medium of example 15, further including instructions that, when executed, cause the one or more processors to perform the method of any one of examples 2 to 8.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded with instructions, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
   determining, by a processor of a controller of a data storage device, that a voltage level of a capacitor in the data storage device is above a threshold voltage value, wherein the data storage device includes a capacitor circuit, and wherein the capacitor circuit includes the capacitor;
   controlling, by the processor, the capacitor circuit to cause the capacitor to provide power to circuitry associated with memory devices of the data storage device along with power provided by a host device operably connected to the data storage device.

2. The method of claim 1, further comprising:
   controlling, by the processor, the capacitor circuit to cease provision of power from the capacitor to prevent the voltage level of the capacitor from reaching a voltage level less than the threshold voltage value.

3. The method of claim 1, wherein controlling the capacitor circuit to cause the capacitor to provide power to the circuitry associated with memory devices comprises:
   receiving, by the controller, a dispatch request event;
   determining, by the processor, a power cost of a number of active memory operations and a number of new memory operations;
   comparing, by the processor, the power cost of the number of active memory operations and the number of new memory operations to a total available power, wherein the total available power is a sum of power available from the capacitor while maintaining the voltage level of the capacitor above the threshold voltage value and power available from the host device; and
   in response to the power cost being less than the total available power, issuing, by the controller, the request.

4. The method of claim 1, further comprising:
   increasing, by the processor, the threshold voltage value based at least in part on at least one characteristic of the capacitor circuit, wherein the at least one characteristic comprises at least one of a temperature of the capacitor, an age of the capacitor, or a number of power-on hours for the capacitor circuit.

5. The method of claim 1, further comprising:
   controlling, by the processor, the capacitor circuit to cause the capacitor to store power from a host device when a power cost of an amount of active memory operations is less than an amount of power available from the host device.

6. The method of claim 1, wherein the threshold voltage value is based on an amount of energy for writing data from volatile memory devices to non-volatile memory devices due to a power loss event.

7. The method of claim 1, further comprising:
   comparing, by the controller, an amount of active memory operations to a drive power limit defined by an amount of power provided by a host device; and
   controlling, by the processor, the capacitor circuit to cause the capacitor to provide power to circuitry associated with the memory devices in response to the amount of active memory operations being above the drive power limit and the voltage level of the capacitor being above the threshold voltage value.

8. The method of claim 1, further comprising:
   organizing, by the controller based on a number of read operations and a number of write operations, an order of execution for the read operations and the write operations;
   executing, by the controller, a number of consecutive write operations; and
   controlling, by the controller, the capacitor circuit to cause the capacitor to provide power to circuitry associated with the memory devices while executing the number of consecutive write operations.

9. A data storage device operably coupled to a host device, the data storage device comprising:
   a controller, wherein the controller includes a processor;
   a capacitor circuit, wherein the capacitor circuit includes a capacitor; and
   a plurality of memory devices;
   wherein the processor is configured to:
      determine that a voltage level of the capacitor is above a threshold voltage value; and
      control the capacitor circuit to cause the capacitor to provide power to circuitry associated with the memory devices along with power provided by the host device.

10. The data storage device of claim 9, wherein the processor is further configured to control the capacitor circuit to cease provision of power from the capacitor to prevent the voltage level of the capacitor from reaching a voltage level less than the threshold voltage value.

11. The data storage device of claim 9,
wherein the controller is further configured to receive a dispatch request event; and
wherein the processor is further configured to
determine a power cost of a number of active memory operations and a number of new memory operations;
compare the power cost of the number of active memory operations and the number of new memory operations to a total available power, wherein the total available power is a sum of power available from the capacitor while maintaining the voltage level of the capacitor above the threshold voltage value and power available from the host device; and
issue, in response to the power cost being less than the total available power, the request.

12. The data storage device of claim 9, wherein the processor is further configured to increase the threshold voltage value based at least in part on at least one characteristic of the capacitor circuit, wherein the at least one characteristic comprises at least one of a temperature of the capacitor, an age of the capacitor, or a number of power-on hours for the capacitor circuit.

13. The data storage device of claim 9, wherein the processor is further configured to control the capacitor circuit to cause the capacitor to store power from a host device when a power cost of an amount of active memory operations is less than an amount of power available from the host device.

14. The data storage device of claim 9, wherein the controller is further configured to
execute a number of consecutive write operations; and
control the capacitor circuit to cause the capacitor to provide power to circuitry associated with the memory devices while executing the number of consecutive write operations.

15. A computer-readable data storage device comprising instructions that, when executed, configure one or more processors of the data storage device to:
determine that a voltage level of a capacitor in the data storage device is above a threshold voltage value, wherein the data storage device includes a capacitor circuit, and wherein the capacitor circuit includes the capacitor;
control the capacitor circuit to cause the capacitor to provide power to circuitry associated with memory devices of the data storage device along with power provided by a host device operably connected to the data storage device.

16. The computer-readable data storage device of claim 15, further comprising instructions that, when executed, configure the one or more processors to control the capacitor circuit to cease provision of power from the capacitor to prevent the voltage level of the capacitor from reaching a voltage level less than the threshold voltage value.

17. The computer-readable data storage device of claim 15, further comprising instructions that, when executed, configure the one or more processors to:
receive a dispatch request event;
determine a power cost of a number of active memory operations and a number of new memory operations;
compare the power cost of the number of active memory operations and the number of new memory operations to a total available power, wherein the total available power is a sum of power available from the capacitor while maintaining the voltage level of the capacitor above the threshold voltage value and power available from the host device; and
issue, in response to the power cost being less than the total available power, the request.

18. The computer-readable data storage device of claim 15, further comprising instructions that, when executed, configure the one or more processors to increase the threshold voltage value based at least in part on at least one characteristic of the capacitor circuit, wherein the at least one characteristic comprises at least one of a temperature of the capacitor, an age of the capacitor, or a number of power-on hours for the capacitor circuit.

19. The computer-readable data storage device of claim 15, further comprising instructions that, when executed, configure the one or more processors to control the capacitor circuit to cause the capacitor to store power from a host device when a power cost of an amount of active memory operations is less than an amount of power available from the host device.

20. The computer-readable data storage device of claim 15, further comprising instructions that, when executed, configure the one or more processors to:
execute a second number of consecutive write operations; and
control the capacitor circuit to cause the capacitor to provide power to circuitry associated with memory devices while executing the number of consecutive write operations.

* * * * *